(12) United States Patent
Shimizu et al.

(10) Patent No.: US 11,795,397 B2
(45) Date of Patent: Oct. 24, 2023

(54) DRY ETCHING GAS COMPOSITION COMPRISING SULFUR-CONTAINING FLUOROCARBON COMPOUND AND DRY ETCHING METHOD USING THE SAME

(71) Applicant: KANTO DENKA KOGYO CO., LTD., Tokyo (JP)

(72) Inventors: Hisashi Shimizu, Gunma (JP); Korehito Kato, Gunma (JP)

(73) Assignee: KANTO DENKA KOGYO CO., LTD., Tokyo (JP)

( * ) Notice: Subject to any disclaimer, the term of this patent is extended or adjusted under 35 U.S.C. 154(b) by 0 days.

(21) Appl. No.: 17/577,554

(22) Filed: Jan. 18, 2022

(65) Prior Publication Data

US 2022/0135882 A1    May 5, 2022

Related U.S. Application Data

(62) Division of application No. 17/288,274, filed as application No. PCT/JP2019/041827 on Oct. 25, 2019.

(30) Foreign Application Priority Data

Oct. 26, 2018    (JP) .................................. 2018-202117

(51) Int. Cl.
  *H01L 21/3065*    (2006.01)
  *C09K 13/00*    (2006.01)
  (Continued)

(52) U.S. Cl.
  CPC .......... *C09K 13/00* (2013.01); *H01L 21/3065* (2013.01); *H01L 21/31116* (2013.01); *H01J 37/3244* (2013.01); *H01J 2237/334* (2013.01)

(58) Field of Classification Search
  None
  See application file for complete search history.

(56) References Cited

U.S. PATENT DOCUMENTS

| 5,376,234 A | 12/1994 | Yanagida |
| 2016/0307764 A1* | 10/2016 | Gupta ............... H01L 21/32137 |

(Continued)

FOREIGN PATENT DOCUMENTS

| JP | H0613351 A | 1/1994 |
| JP | 2016149451 A | 8/2016 |

(Continued)

OTHER PUBLICATIONS

International Search Report of PCT/JP2019/041824, dated Dec. 24, 2019.

(Continued)

*Primary Examiner* — Shamim Ahmed
(74) *Attorney, Agent, or Firm* — BROWDY AND NEIMARK, PLLC

(57) ABSTRACT

Provided is a novel etching gas composition that comprises a sulfur-containing compound and that can selectively etch $SiO_2$ over low dielectric constant materials (low-k materials; SiON, SiCN, SiOCN, SiOC). A dry etching gas composition comprises a saturated and cyclic sulfur-containing fluorocarbon compound that is represented by general formula (1) of $C_xF_yS_z$ where x, y, and z are $2 \leq x \leq 5$, $y \leq 2x$, and $1 \leq z \leq 2$.

13 Claims, 2 Drawing Sheets

Etching Rate (top: C4F8, bottom: C4F8S) *ON is an average of SiO2 and SiN

(51) Int. Cl.
*H01L 21/311* (2006.01)
*H01J 37/32* (2006.01)

(56) References Cited

U.S. PATENT DOCUMENTS

2017/0194426 A1* 7/2017 Min .................. H01L 21/76224
2019/0148167 A1* 5/2019 Kim .................. H01L 21/32139
252/79

FOREIGN PATENT DOCUMENTS

| KR | 100574923 A | | 2/2001 |
| KR | 20010010568 A | * | 2/2001 |
| WO | 2015035381 A1 | | 3/2015 |

OTHER PUBLICATIONS

International Search Report of PCT/JP2019/041827, dated Dec. 24, 2019.

* cited by examiner

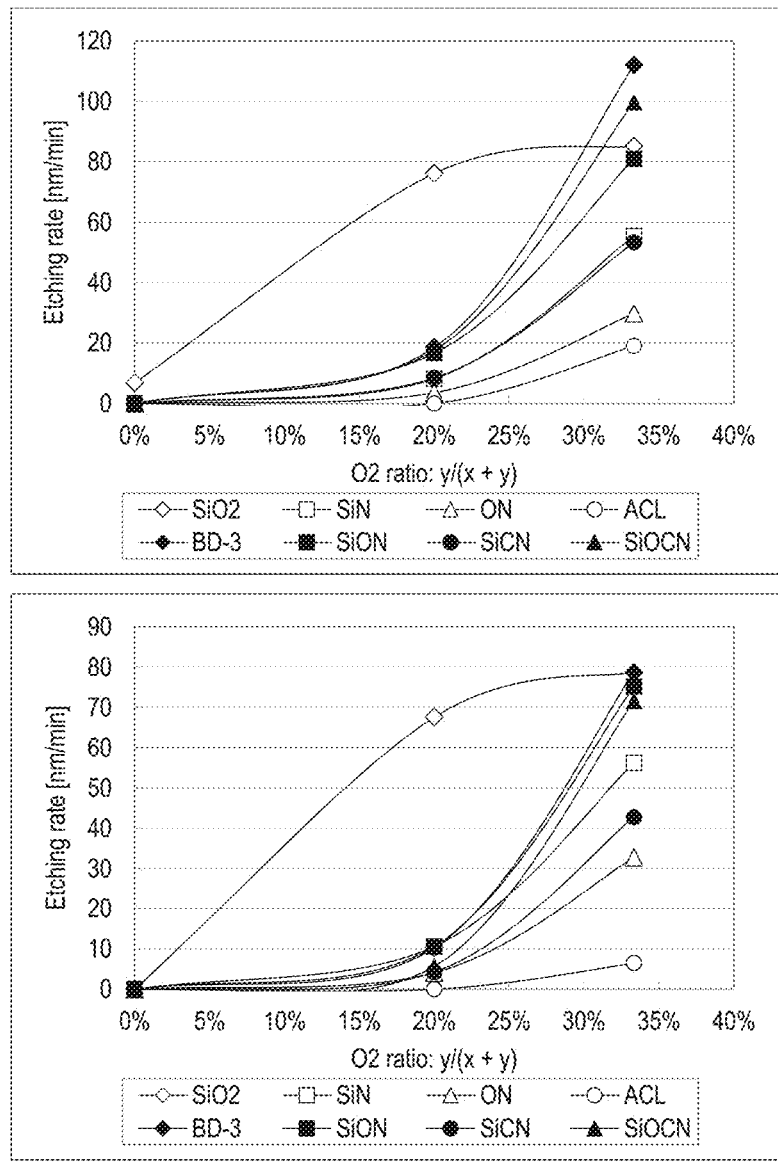
FIG. 1  Etching Rate (top: C4F8, bottom: C4F8S) *ON is an average of SiO2 and SiN

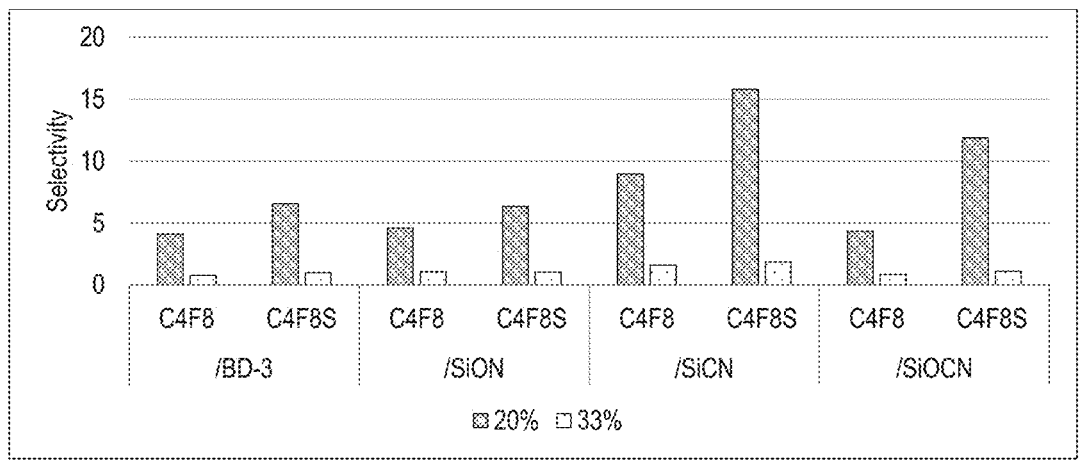
FIG. 2  SiO2 Selectivity
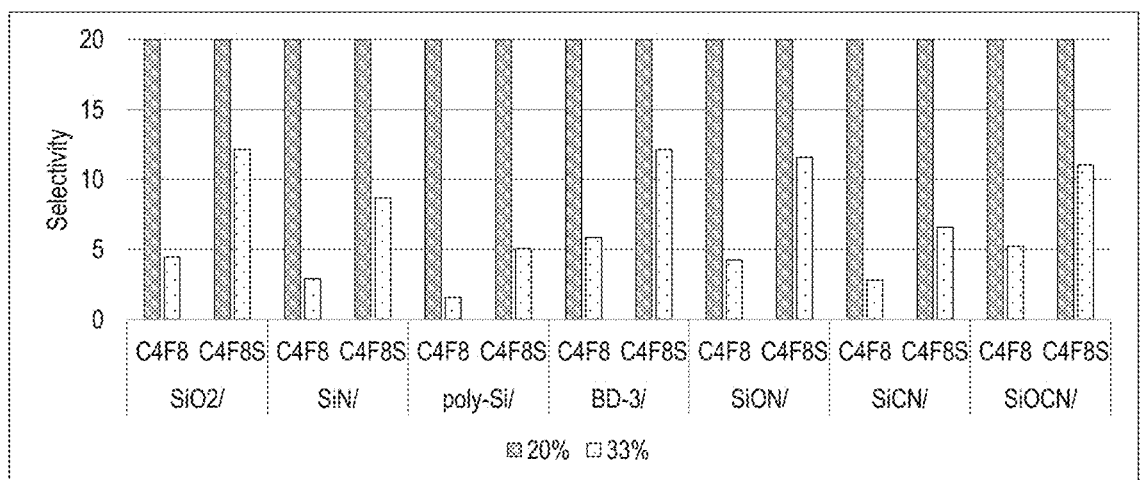
FIG. 3  Selectivity over ACL (infinite selectivity under conditions of 20% for all the Examples and Comparative Examples)

DRY ETCHING GAS COMPOSITION COMPRISING SULFUR-CONTAINING FLUOROCARBON COMPOUND AND DRY ETCHING METHOD USING THE SAME

TECHNICAL FIELD

The present invention relates to a dry etching gas composition comprising a sulfur-containing fluorocarbon compound and to a dry etching method using the composition.

BACKGROUND ART

Along with the shift towards miniaturization and 3D configurations of semiconductor devices, the needs for an etching process have become increasingly demanding year after year. For this reason, the development of novel etching technology that meets such demanding needs is desired. In recent years, low dielectric constant materials, such as a carbon-containing silicon-based film represented by SiOC, have been used to reduce increasing parasitic capacitance associated with miniaturization of semiconductor devices. However, it is difficult to selectively etch, by using existing FC gases or HFC gases, a silicon oxide film or a silicon nitride film over low dielectric constant materials. In actual device fabrication, damage to a low dielectric constant film (changes in electric characteristics, such as dielectric constant, due to changes in film composition or structure caused by ion penetration or UV light generated from plasma) during dry etching poses a problem.

The present inventors have proposed that an etching gas composition containing a specific hydrofluorocarbon (1,1,4,4-tetrafluoro-1,3-butadiene) is effective as a means to resolve the above-mentioned problem (Patent Literature (PTL) 1).

CITATION LIST

Patent Literature

PTL 1: Japanese Unexamined Patent Application Publication No. 2016-149451

SUMMARY OF INVENTION

Technical Problem

An object of the present invention is to provide a novel etching gas composition that comprises a sulfur-containing compound and that can selectively etch $SiO_2$ over low dielectric constant materials (low-k materials; SiON, SiCN, SiOCN, SiOC).

Solution to Problem

According to the present invention the following are provided.

[1] A dry etching gas composition comprising a saturated and cyclic sulfur-containing fluorocarbon compound that is represented by general formula (1) of $C_xF_yS_z$ where x, y, and z are $2 \leq x \leq 5$, $y \leq 2x$, and $1 \leq z \leq 2$.

[2] The di etching gas composition according to [1], where the sulfur-containing fluorocarbon compound is 2,2,3,3,4,4,5,5-octafluorotetrahydrothiophene ($C_4F_8S$).

[3] The dry etching gas composition according to [1] or [2], comprising the sulfur-containing fluorocarbon compound in an amount of 1 to 100 vol %.

[4] The dry etching gas composition according to any one of [1] to [3], further comprising, in addition to the sulfur-containing fluorocarbon compound, at least one oxygen-containing compound selected from the group consisting of $O_2$, $O_3$, CO, $CO_2$, NO, $NO_2$, $SO_2$, and $SO_3$.

[5] The dry etching gas composition according to any one of [1] to [4], further comprising, in addition to the sulfur-containing fluorocarbon compound, at least one inert gas selected from the group consisting of $N_2$, He, Ar, Ne, and Xe.

[6] A dry etching method comprising plasma etching, by using the dry etching gas composition according to any of [1] to [5], a stacked structure containing at least two or more selected from the group consisting of (a1) a carbon-containing silicon-based film, (a2) a crystalline silicon film, (a3) an amorphous silicon film, (a4) a polycrystalline silicon film (polysilicon film), (a5) a silicon oxynitride film, (a6) an amorphous carbon film, (a7) a photoresist filet, (a8) a silicon oxide film, and (a9) a silicon nitride film, thereby individually or simultaneously selectively etching films excluding (a6) the amorphous carbon film and (a7) the photoresist film.

[7] A dry etching method comprising plasma etching, by using the dry etching gas composition according to any of [1] to [5], a stacked structure containing at least two or more selected from the group consisting of (a1) a carbon-containing silicon-based film, (a2) a crystalline silicon film, (a3) an amorphous silicon film, (a4) a polycrystalline silicon film (polysilicon film), (a5) a silicon oxynitride film, (a6) an amorphous carbon film, (a7) a photoresist film, and (a8) a silicon oxide film, thereby selectively etching (a8) the silicon oxide film alone.

[8] The dry etching method according to [6] or [7], where etching is performed by generating a plasma of the etching gas composition according to any of [1] to [5] to form S-containing ions or active species.

[9] The dry etching method according to any of [6] to [8], where etching by the dry etching gas composition according to any of [1] to [5] is performed under plasma conditions that enable simultaneous etching of (b1) a silicon oxide film and (b2) a silicon nitride film.

Advantageous Effects of Invention

The present invention provides a novel etching gas composition that comprises a sulfur-containing compound and that can selectively etch $SiO_2$ over low dielectric constant materials (low-k materials; SiON, SiCN, SiOCN, SiOC).

BRIEF DESCRIPTION OF DRAWINGS

FIG. 1 shows the results of an etching test,
FIG. 2 shows the $SiO_2$ selectivity of an etching composition of the present invention.
FIG. 3 shows, as a bar graph, the results of the etching test relative to the etching rate of ACL.

DESCRIPTION OF EMBODIMENTS

The dry etching gas composition in the present invention encompasses a mixed gas of a saturated and cyclic sulfur-containing fluorocarbon compound that is represented by general formula (1) below or a single-component gas thereof:

  General formula (1)

where x, y, and z are $2 \leq x \leq 5$, $y \leq 2x+2$, and $1 \leq z \leq 2$.

In view of easy handling of a dry etching gas, it is preferable to use compounds satisfying x=2 to 5, y=4 to 10, and z=1 in general formula (1). Exemplary suitable compounds include the following.

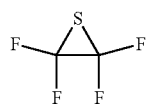

Tetrafluorothiirane ($C_2F_4S$)

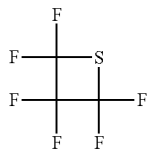

2,2,3,3,4,4-Hexafluorothietane ($C_3F_6S$)

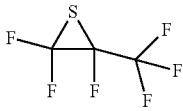

2,2,3-Trifluoro-3-(trifluoromethyl)thiirane ($C_3F_6S$)

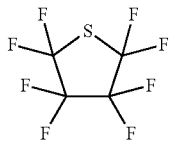

2,2,3,3,4,4,5,5-Octafluorotetrahydrothiophene ($C_4F_8S$)

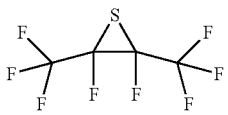

2,3-Difluoro-2,3-bis(trifluoromethyl)thiirane ($C_4F_8S$)

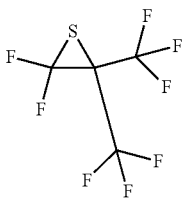

2,2-Difluoro-3,3-bis(trifluoromethyl)thiirane ($C_4F_8S$)

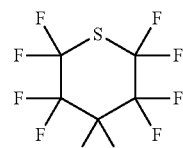

2,2,3,3,4,4,5,5,6,6-Decafluorotetrahydro-2H-thiopyran ($C_5F_{10}S$)

In the dry etching gas composition in the present invention, a sulfur-containing fluorocarbon compound represented by general formula (1) having a purity of 95.0 vol % to 100.0 vol % is preferably used. A sulfur-containing fluorocarbon compound having a purity of 99 vol % or more is more preferably used, and a sulfur-containing fluorocarbon compound having a purity of 9.99 vol % or more is further preferably used. Examples of impurity components contained include $N_2$, $O_2$, $CO_2$, $H_2O$, HF, HCl, $SO_2$, and $CH_4$. Among these impurity components, $H_2O$, HCl, $SO_2$, and the like are highly likely to corrode distribution channels for gases and thus preferably removed as much as possible through purification.

By using a sulfur-containing fluorocarbon compound represented by general formula (1) mixed with another fluorocarbon (FC) gas or a hydrofluorocarbon (HFC) gas, the dry etching gas composition in the present invention can further enhance the selectivity of an etching target material over materials excluding the etching target material as compared with the case without incorporating a compound represented by general formula (1). Moreover, in the case of etching a structure patterned with a material excluding the etching target material, accuracy in vertical processing is also improved.

When an etching target material is an oxygen-containing Si-based material, such as $SiO_2$, in a structure patterned with a material excluding the etching target material as mentioned above, it is preferable to use a compound represented by general formula (1) mixed with an etching gas, such as $CF_4$, $CHF_3$, $C_2F_6$, $C_3F_8$, $C_4F_8$, $C_4F_6$, or $C_5F_8$, in view of selective etching and etching with satisfactory accuracy in vertical processing. In particular, when a high selectivity is needed, it is preferable to mix with $C_4F_8$, $C_4F_6$, or $C_5F_8$ having a high C number.

When an etching target material is a nitrogen-containing Si-based material, such as SiN, in a structure patterned with a material excluding the etching target material, it is preferable to use, for plasma etching, a gas compound represented by general formula (1) mixed with a HFC gas, such as $CHF_3$, $CH_2F_2$, or $CH_3F$, in view of selective etching and etching with satisfactory accuracy in vertical processing. In particular, when a high selectivity is needed, it is also effective to use a HFC gas having a C number of 2 or more.

By adding at least one oxygen-containing compound selected from the group consisting of $O_2$, $O_3$, CO, $CO_2$, NO, $NO_2$, $SO_2$, and $SO_3$ to a composition containing a compound represented by general formula (1), the dry etching gas composition in the present invention can obtain the effects of suppressing excessive deposition (deposits), increasing the etching rate of an etching target, and enhancing the selectivity of the etching target over materials excluding the etching target.

In the dry etching gas composition in the present invention, at least one inert gas selected from the group consisting of $N_2$, He, Ar, Ne, and Xe may be added to the composition containing a compound represented by general formula (1). Among these inert gases, He, Ar, or Xe is preferably used.

Exemplary etching gases used in the method of the present invention include the following.

(a) The method can be carried out using a compound represented by general formula (1) having a purity of 90 vol % or more, and the method is preferably carried out using the compound having a purity of 99 vol % or more and is particularly preferably carried out using the compound having a purity of 99.999 vol % or more.

(b) A dry etching composition used for etching preferably contains 1 to 100 vol % of a compound represented by general formula (1).

(c) A dry etching composition used for etching preferably contains, in addition to a compound represented by general formula (1), at least one selected from the oxygen atom-containing compound group consisting of $O_2$, $O_3$, CO, $CO_2$, NO, $NO_2$, $SO_2$, and $SO_3$. In particular, $O_2$ is preferably used.

The proportion of the oxygen atom-containing compound is preferably 5 to 50% and particularly preferably 10 to 35% relative to the total amount of the compound represented by general formula (1) and the oxygen atom-containing compound.

(d) A dry etching composition used for etching preferably contains, in addition to a compound represented by general formula (1) as well as in addition to or in place of the above-mentioned oxygen atom-containing compound group, at least one selected from the inert gas group consisting of rare gases and $N_2$. In particular, Ar is preferably used. The proportion of an inert gas contained in the etching gas composition is preferably 1 to 80 vol % and particularly preferably 50 to 75 vol %.

As a dry etching apparatus used for dry etching in the present invention, any apparatus used in the technical field concerned can be used without particular limitation. For example, an apparatus of helicon wave mode, high frequency induction mode, parallel plate configuration mode, magnetron mode, microwave mode, or the like is usable.

The dry etching method in the present invention is for vertical processing of a fine pattern wafer of a Si-based material. Accordingly, the etching apparatus needs to be an apparatus suitable for ion-assisted etching and equipped with a vacuum chamber that can reproduce low gas pressure conditions. Under low pressure conditions, particles in a plasma tend to travel in straight line and ions for irradiating a substrate reach the substrate without being blocked by other particles. Consequently, such low pressure conditions are advantageous for vertical processing since ions incident normal to the substrate increase. In the dry etching method in the present invention, the pressure inside the vacuum chamber during etching is preferably adjusted to 100 Torr to 0.1 mTorr and further preferably adjusted to 100 mTorr to 0.1 mTorr.

In the dry etching method in the present invention, a compound represented by general formula (1) is preferably introduced as a gas into a vacuum chamber of an etching apparatus. For this reason, an etching apparatus used for the dry etching method in the present invention preferably includes a mechanism for introducing the compound represented by general formula (1) as a gas and further for adjusting the amount introduced. Moreover, regarding such a mechanism, since a plurality of gas compounds including a gas compound represented by general formula (1) and other gas compounds described above, such as $O_2$ and Ar, are effectively used depending on the purposes in the plasma etching method in the present invention, it is preferable to include four or more mechanisms for introducing gases and for adjusting the amounts introduced.

EXAMPLES

The present working examples (etching test) used, as a plasma etching apparatus, a capacitively coupled plasma etching apparatus of parallel plate configuration from SAMCO Inc. The composition of a deposit film was determined by an SEM-EDX (scanning electron microscope/energy dispersive X-ray spectroscopy).

As a silicon oxide film ($SiO_m$; m is a natural number), a $SiO_2$ film deposited at a thickness of 1000 nm on a silicon wafer by plasma CVD was used. As a silicon nitride film (SiN), a SiN film deposited at a thickness of 300 nm on a silicon wafer by thermal CVD was used. As an amorphous carbon film (ACL), ACL deposited at a thickness of 400 nm on a silicon wafer by plasma CVD was used. As a carbon-containing silicon film (SiOC), Black Diamond-3 (hereinafter, BD-3), which is a registered trademark from Applied Materials, Inc., deposited at a thickness of 500 nm on a silicon wafer was used. As a SiON film, SiON deposited at a thickness of 500 nm on a silicon wafer by plasma CVD was used. As a SiCN film, SiCN deposited at a thickness of 500 nm on a silicon wafer by plasma CVD was used. As a SiOCN film, SiOCN deposited at a thickness of 500 nm on a silicon wafer by plasma CVD was used.

The sample film thickness during etching was measured using an interference-mode film thickness meter. The etching conditions are shown in Table 1 below. The etching rate of a gas was calculated according to the following formula, $$\text{Etching rate (nm/min)} = \frac{\text{sample film thickness before etching (nm)} - \text{sample film thickness after etching (nm)}}{\text{etching time (min)}} \quad \text{[Math. 1]}$$

The A/B selectivity was calculated according to the following formula.

A/B selectivity=etching rate of A film (nm/min)
÷etching rate of B film (nm/min)

Etching Test

An etching test was performed under conditions shown in Table 1 for various samples in which $SiO_2$, SiN, ACL, and so forth had been deposited on each silicon wafer. For etching gases, perfluorocyclobutane (1,1,2,2,3,3,4,4-octafluorocyclobutane ($C_4F_8$)) as a sulfur-free Comparative Example and perfluorothiacyclopentane (2,2,3,3,4,4,5,5-octafluorotetrahydrothiophene ($C_4F_8S$)) represented by the formula below as a sulfur-containing Example of the present invention were used.

[Chem. 8]

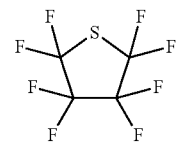

TABLE 1

| Etching Test Conditions SAMCO RIE-10NR | |
|---|---|
| Ar/etching gas/$O_2$ | 50/20 (x)/**(y) [sccm] |
| Pressure | 10.0 [Pa] |
| RF power | 300 [W] |

The test results are shown in FIG. 1. In FIG. 1, BD-3 represents Black Diamond 3. Ar and an etching gas were allowed to flow constantly at rates of 50 sccm and 20 sccm, respectively, while varying the rate (sccm) of oxygen ($O_2$). The etching of ACL started at around over 20% of the rate of oxygen relative to the total (x+y) of an etching gas (x) and oxygen (y).

In the case of the etching gas ($C_4F_8S$) of the Example, the etching rate of $SiO_2$ sharply increased with the increase in $O_2$ ratio to reach the maximum (approximately 80 nm/min) at the $O_2$ ratio of near 25%. Concerning the etching rate of $SiO_2$, the Comparative Example ($C_4F_8$) also exhibited the similar behavior. Moreover, both the etching gas ($C_4F_8S$) of the Example and the etching gas ($C_4F_8$) of the Comparative Example exhibited, although differences in etching rate values are observed, the similar behavior in which the etching rates of SiN, BD-3, SiON, SiCN, and SiOCN increase gradually with the increase in $O_2$ ratio and start to increase sharply at around the $O_2$ ratio of over 20%.

For the results in the Example and Comparative Example, the etching rate ratios of $SiO_2$/BD-3, $SiO_2$/SiON, $SiO_2$/SiCN, and $SiO_2$/SiOCN are obtained and summarized in FIG. 2. As shown in FIG. 2, the behavior in which the etching rate ratios are high at the $O_2$ ratio of 20% but are low at the $O_2$ ratio of 33% was confirmed for both the Example and the Comparative Example.

For the results in the Example and the Comparative Example, the etching rate ratios of $SiO_2$/ACL, SiN/ACL, polysilicon (Poly-Si)/ACL, BD-3/ACL, SiON/ACL, SiCN/ACL, and SiOCN/ACL at the $O_2$ ratio of 33% are obtained and summarized in FIG. 3. FIG. 3 reveals that the etching gas of the Example exhibits, for all the materials, higher etching rate ratios relative to ACL than the etching gas of the Comparative Example.

The foregoing results revealed that remarkable differences in etching behavior exist between the Example of the present invention, in which a sulfur-containing etching gas is used, and the Comparative Example, in which a conventional sulfur-free etching gas is used. In other words, it can be concluded that the novel etching gas of the present invention has high selectivity between $SiO_2$ and low-k materials (SiON, SiCN, SiOCN, SiOC) similar to a conventional etching gas. Meanwhile, by adopting a novel sulfur-containing compound, the etching rate of ACL does not increase in the present invention despite the increase in $O_2$ ratio. Consequently, the etching selectivity between ACL and low-k materials is higher than a conventional etching gas, Moreover, by using the etching gas of the present invention in combination with a conventional etching gas, it is possible to change a difference in etching rate between ACL and low-k materials, thereby making further accurate etching possible.

The invention claimed is:

1. A dry etching method, comprising plasma etching, with a dry etching gas composition consisting of:
   a saturated and cyclic sulfur-containing fluorocarbon compound that is 2,2,3,3,4,4,5,5-octafluorotetrahydrothiophene;
   at least one oxygen-containing compound selected from the group consisting of $O_2$, $O_3$, CO, $CO_2$, NO, $NO_2$, $SO_2$, and $SO_3$; and
   optionally, at least one compound selected from the group consisting of:
   at least one inert gas;
   at least one fluorocarbon (FC); and
   at least one hydrofluorocarbon (HFC),
   a stacked structure containing at least two or more selected from the group consisting of (a1) a carbon-containing silicon-based film, (a2) a crystalline silicon film, (a3) an amorphous silicon film, (a4) a polycrystalline silicon film (polysilicon film), (a5) a silicon oxynitride film, (a6) an amorphous carbon film, (a7) a photoresist film, (a8) a silicon oxide film, and (a9) a silicon nitride film, thereby individually or simultaneously selectively etching films excluding (a6) the amorphous carbon film and (a7) the photoresist film,
   wherein the dry etching gas composition comprises the sulfur-containing fluorocarbon compound in an amount of 1 to 80 vol %, and the oxygen-containing compound in an amount of 20 to 33 vol % relative to the total of the sulfur-containing fluorocarbon compound and the oxygen-containing compound.

2. The dry etching method according to claim 1, wherein etching is performed by generating a plasma of the etching gas composition to form S-containing ions or active species.

3. The dry etching method according to claim 1, wherein etching by the dry etching gas composition is performed under plasma conditions that enable simultaneous etching of (b1) a silicon oxide film and (b2) a silicon nitride film.

4. The dry etching method according to claim 1, wherein the at least one inert gas is selected from the group consisting of $N_2$, He, Ar, Ne, and Xe.

5. The dry etching method according to claim 1, wherein the at least one fluorocarbon (FC) is selected from the group consisting of $CF_4$, $C_2F_6$, $C_3F_8$, $C_4F_8$, $C_4F_6$, and $C_5F_8$.

6. The dry etching method according to claim 1, wherein the at least one hydrofluorocarbon (HFC) is selected from the group consisting of $CHF_3$, $CH_2F_2$, and $CH_3F$.

7. The dry etching method according to claim 1, wherein the at least one inert gas is present in the dry etching gas composition in an amount of 1 to 80 vol %.

8. The dry etching method according to claim 1, wherein the dry etching gas composition consists of:
   a saturated and cyclic sulfur-containing fluorocarbon compound that is 2,2,3,3,4,4,5,5-octafluorotetrahydrothiophene;
   at least one oxygen-containing compound selected from the group consisting of $O_2$, $O_3$, CO, $CO_2$, NO, $NO_2$, $SO_2$, and $SO_3$; and
   at least one inert gas selected from the group consisting of $N_2$, He, Ar, Ne, and Xe.

9. The dry etching method according to claim 8, wherein the at least one oxygen-containing compound is $O_2$ and the at least one inert gas is Ar.

10. A dry etching method comprising plasma etching, with a dry etching gas composition consisting of:
    a saturated and cyclic sulfur-containing fluorocarbon compound that is 2,2,3,3,4,4,5,5-octafluorotetrahydrothiophene;
    at least one oxygen-containing compound selected from the group consisting of $O_2$, $O_3$, CO, $CO_2$, NO, $NO_2$, $SO_2$, and $SO_3$; and
    optionally, at least one compound selected from the group consisting of:
    at least one inert gas;
    at least one fluorocarbon (FC); and
    at least one hydrofluorocarbon (HFC),
    a stacked structure containing at least two or more selected from the group consisting of (a1) a carbon-containing silicon-based film, (a2) a crystalline silicon film, (a3) an amorphous silicon film, (a4) a polycrystalline silicon film (polysilicon film), (a5) a silicon oxynitride film, (a6) an amorphous carbon film, (a7) a photoresist film, and (a8) a silicon oxide film, thereby selectively etching (a8) the silicon oxide film alone,
    wherein the dry etching gas composition comprises the sulfur-containing fluorocarbon compound in an amount of 1 to 80 vol %, and the oxygen-containing compound in an amount of 20 to 33 vol % relative to the total of the sulfur-containing fluorocarbon compound and the oxygen-containing compound.

11. The dry etching method according to claim 10, wherein etching is performed by generating a plasma of the etching gas composition to form S-containing ions or active species.

12. The dry etching method according to 8, wherein etching by the dry etching gas composition is performed under plasma conditions that enable simultaneous etching of (b1) a silicon oxide film and (b2) a silicon nitride film.

13. The dry etching method according to claim 10, wherein the at least one inert gas is selected from the group consisting of $N_2$, He, Ar, Ne, and Xe.

* * * * *